United States Patent [19]

Stewart et al.

[11] 4,044,341
[45] Aug. 23, 1977

[54] MEMORY ARRAY

[75] Inventors: Roger Green Stewart, Neshanic Station; Joel Roy Oberman, Somerville, both of N.J.

[73] Assignee: RCA Corporation, New York, N.Y.

[21] Appl. No.: 668,909

[22] Filed: Mar. 22, 1976

[51] Int. Cl.² .............................................. G11C 11/00
[52] U.S. Cl. ............................................... 340/173 R
[58] Field of Search ................... 340/173 DR, 173 R; 307/238

[56] References Cited

U.S. PATENT DOCUMENTS 3,735,368  5/1973  Beausoleil .................... 340/173 R Primary Examiner—Vincent P. Canney
Attorney, Agent, or Firm—H. Christoffersen; Henry I. Schanzer

[57] ABSTRACT

A memory array includes row conductors which have to be charged to a first level prior to each read-out cycle. During a read-out cycle the row conductors may or may not be discharged to a second level depending on whether a "1" or a "0" is stored at selected bit locations. The memory array also includes "dummy" row conductors which are discharged to the second level each time the contents of the array are read out. Means are provided for charging the row conductors including the "dummy" row conductors to the first level prior to each read-out, for sensing the charge level on the "dummy" row conductors, and for terminating the charging cycle when the charge level on the "dummy" row conductors reaches the first level.

9 Claims, 1 Drawing Figure

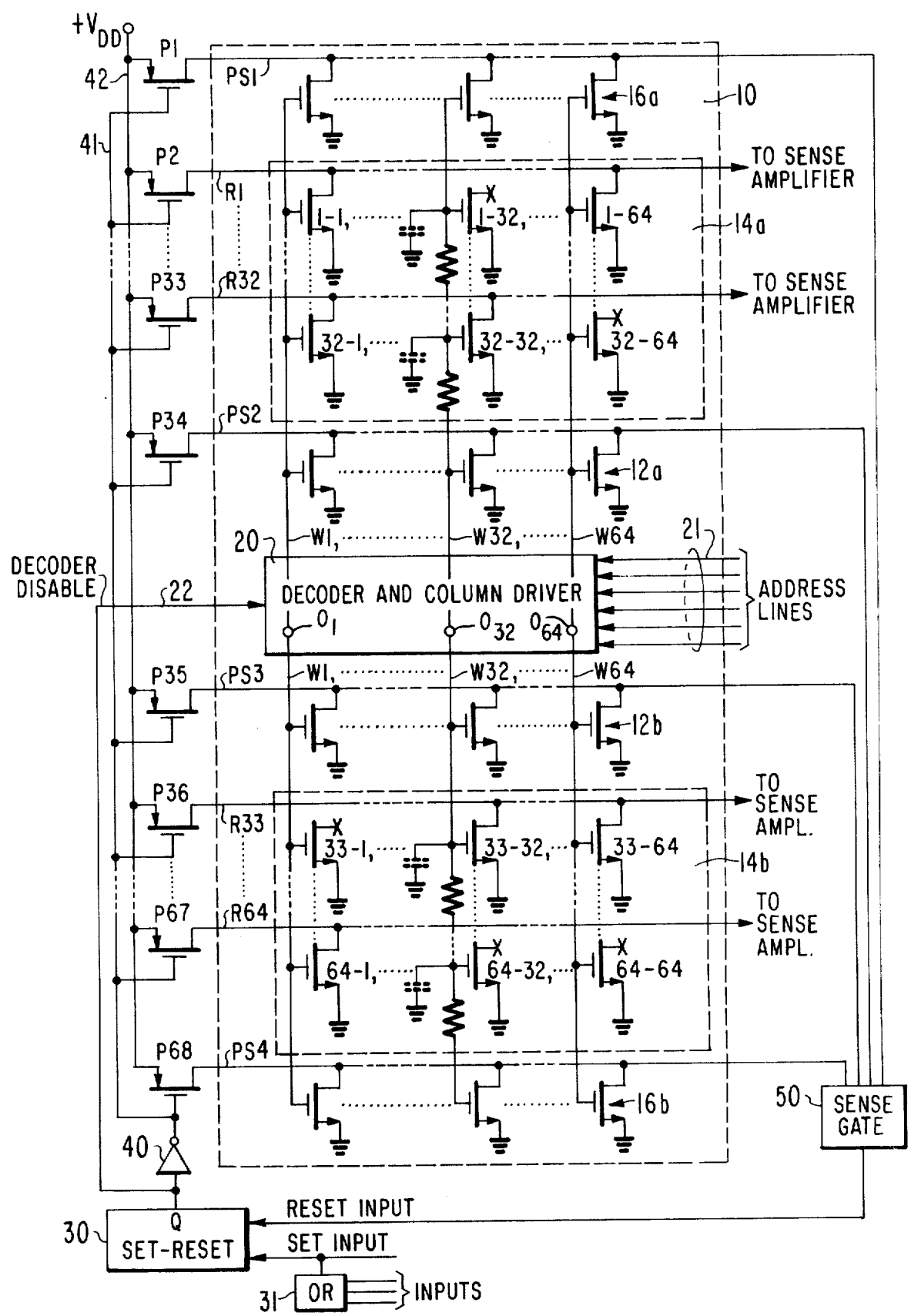

MEMORY ARRAY

This invention relates to a memory array and, more particularly, to means for placing the array in a desired condition.

It is often desirable and/or necessary that certain nodes or lines of a memory array be charged to a known voltage before starting to read data out of the memory. Since the time alloted to charge or "precharge" adds directly to memory access time, this time should be as short as possible consistent with reliable operating of the memory. Memory access time as used herein includes: (a) the time needed to precharge the array to a desired condition; and (b) the time to read the contents of the array.

Known precharge techniques require the application of a charging pulse for a period of time which is sufficiently long to ensure that the memory array is charged to the desired level under the worst case conditions. To satisfy this criterion, an excessively long period of time has to be allocated for the precharge cycle. This is necessary because of the many variations in propagation delays along different portions of the memory array, variations in fabrication, and different response times due to different values of operating voltages. Thus, whether a particular memory has less propagation delays than another or less delay for some operating condition, the precharge period must still be made long enough to allow for worst case timing (longest) delays.

Memory arrays embodying the invention include at least one "dummy" row conductor, means for placing (charging) it and other row conductors of the array at a first level prior to each read-out cycle, and means for placing (discharging) the dummy row conductor at a second level each time the contents of the memory array are read out. Also included are means connected to the dummy row conductor for sensing its charge level and for terminating the charging of the row conductors when its charge level reaches a predetermined voltage level.

The sole FIGURE is a semi-schematic semi-block diagram of a memory array embodying the invention.

The circuit illustrated in the FIGURE includes insulated-gate field-effect transistors (IGFETs). However, this is not intended to preclude the use of other suitable devices and to this end, the term "transistor", when used without limitation in the appended claims, is used in a generic sense. The transistors of P-conductivity type are identified by the letter P followed by a particular reference numeral and an arrow pointing towards the body of the transistor and transistors of N-conductivity type are identified by an arrow pointing away from the body of the transistor. In the discussion to follow it is assumed that the most positive operating potential applied to the components of the system is +V volts in amplitude and that the most negative is ground or zero volts. Also, a "high" level or +V volts level is arbitrarily defined as a logic "1" and a "low" level or zero volts level is arbitrarily defined as a logic "0".

The circuit of the FIGURE includes a read-only memory (ROM) array 10 comprised of 64 rows or bit lines, R1 through R64, and 4 "dummy" row conductors or precharge sense lines, PS1 through PS4. Sixty-four (64) column conductors or word lines, W1 through W64, disposed in an orthogonal direction to the rows, are common to all the rows.

The intersection of each row and column conductor defines a bit location. There is a single insulated-gate field-effect transistor (IGFET) of N-conductivity type at each bit location. The gate electrode of each transistor in a column is connected to the column conductor for that column and the sources of all the transistors of the array are connected to ground potential. If the transistor at a bit location (e.g. 1-1, 1-64, 33-64) has its drain connected to the row associated with that bit location then that bit location is arbitrarily defined as storing a "0". If the transistor at a bit location (e.g. 1-32, 32-64, 64-64) does not have its drain connected to the row associated with that bit location then that bit location is arbitrarily defined as storing a "1".

There is associated with the column conductors distributed resistance and capacitance as shown for column W32 in the FIGURE. (The row conductors are metallized and their impedance is neglible). As a result, there are delays in the propagation of signals along the column conductors. To reduce the delaying effect of the distributed impedances, the array is preferably, though not necessarily, divided into two sections, as shown, and a decoder 20 is located in the center of the array for driving the columns from their midpoints towards both ends. This reduces the turn on and turn off delays of the rows; especially those farthest from the decoder.

The decoder and column driver 20, which may be any one of a number of known decoding arrangement, has six inputs to which are connected six (6) address lines 21 and a control input to which is connected Decoder Disable Line 22. The decoder has 64 outputs, $0_1$ through $0_{64}$, each output being connected to a different one of the column conductors. When a "high" or +V volts level is present on line 22, the decoder is disabled and each of its outputs goes to a "low" or zero volt level. When a "low" or 0 volt level is present on line 22, the decoder is enabled and can decode the information present on the six address lines and, in response thereto, selects and drives (applies +V volts) to a selected one of the 64 column conductors. Normally, only one of the 64 column conductors has a +V volt (high) level applied to it at any one time.

Each half of the array 10 includes: (a) a dummy row 12a, 12b adjacent to the decoder; (b) a 32 by 64 matrix of data bits, 14a, 14b; and (c) another dummy row 16a, 16b farthest from the decoder. The dummy rows are characterized by having a "0" at each bit location. That is, all the transistors of a dummy row have their drains connected to the precharge sense line (PS1, PS2, PS3, PS4) associated with that row. This ensures that no matter which column conductor is selected, the precharge sense lines will be discharged to ground via a dummy row transistor.

The dummy row transistors are preferably made to have a lower impedance than the "data" transistors in 14a and 14b for the same value of gate-to-source forward bias. The importance of this feature as well as the reasons for the location of the dummy rows are discussed below.

Connected between each row conductor and the +V line 42 is the source-to-drain path of a "charging" P-type IGFET, P1 through P68. The gates of the charging transistors are connected in common to line 41 which, in turn, is connected to the output of inverter 40. When the potential on line 41 is "low", the charging transistors are turned on and charge all the row conductors to +V volts via their conduction paths.

Inverter 40 which may be any known inverter is controlled by Set-Reset circuit 30 which may be any one of a number of known devices whose output can be set to one binary condition and reset to another binary condition. Circuit 30 has a set-input, a reset-input, and a Q-output connected to the input of inverter 40 and to line 22. In response to a low (0 volt) signal applied to the set-input the Q output goes high and remains high until a low (0 volt) signal is applied to the reset-input of circuit 30. Inputs may be applied to the set input directly or via OR gate 31. Circuit 30 functions to produce a steady output level once it is set (or reset) although the setting (or resetting) pulse is of very short duration, e.g. alternating current signal or transient.

The charge on the precharge sense lines PS1 through PS4 is sensed by a sense gate 50 having 4 inputs, each of which is connected to a different one of the 4 dummy row conductors PS1-PS4. The output of the sense gate is connected to the reset-input of circuit 30. The sense gate produces a "low" voltage level if, and only if, all its 4 inputs are at the "high" level. Otherwise, the output of the sense amplifier remains "high". Any known circuit which performs this function may be used. The sense gate 50 may be, for example, a 4 input NAND gate of the type commercially available as the CD4012 or any other suitable circuit which produces a unique output when its inputs are all in the same desired state.

The operation of the circuit may best be appreciated by going through precharge and a read out cycle. For example, a "low" signal is applied to the set-input of circuit 30 each time there is a change in the information on the address lines to the memory array. In response to the setting signal to circuit 30, its Q output goes high and remains high. The high Q output functions to disable decoder 20 causing the signals applied to all the columns to go low. Concurrently, the high Q output applied to the input of inverter 40 causes its output on line 41 to go low. A low on line 41 turns on all the charging transistors P1-P68 causing +V volts to be applied via their low impedance conduction paths to all the row conductors.

The row conductors can charge up to +V volts because all the "bit" transistors of N-conductivity type are turned off or are in the process of being turned off since the columns are driven to the low condition. The low ($\approx$ 0 volt) signal produced at the outputs of decoder 20 discharge the column conductors to ground. The low signals are propagated, from the decoder outputs, along the columns. The transistors along the columns are turned off when the potential at their gates drops below their threshold level ($V_T$). The last transistors which will, normally, be turned off are the transistors in dummy rows 16a, 16b since they are located, physically, farthest from the decoder outputs. Also, these dummy transistors are physically made larger than the other "data" transistors of the array in order to make their "ON" impedances lower than those of the other bit transistors. This ensures that, normally, the "dummy" row conductors are most fully discharged and that it takes longer to recharge them than any of the other row conductors of the array.

As soon as the voltage level on each one of the 4 precharge sense lines ("dummy" row conductors) reaches +V volts or comes close to +V volts the four inputs to sense gate 50 go high. Sense gate 50 then produces a low signal which is applied to the reset-input of circuit 30. This resets the Q output to the low level condition, removing the disabling signal to decoder 20 and causing the output of inverter 40 to go high which turns off charging transistors P1-P68.

Decoder 20 in response to the information on address line 21 applies a +V volts signal to a selected column which applies a forward bias to all the column transistors of the selected column. The transistors of a selected column having their drains connected to a row conductor cause the discharge of that row conductor to ground through their source-to-drain conduction paths. Therefore, the dummy row conductors (PS1-PS4) are discharged to ground. The transistors of a selected column which are not connected at their drains to a row conductor have no effect on the row conductor's level of charge and that row conductor remains charged to +V volts. The voltage levels on the row conductors, indicative of the logic state stored at the intersections of a selected column and the rows, are read out or sensed by sense amplifiers (not shown) for utilization by other circuits (not shown).

Following the discharge of the dummy row conductors, at least one of the inputs to sense gate 50 is low and its output goes high. Any subsequent "low" signal applied to the set input of circuit 30 causes the turn on of the charging transistors and the row conductors to be charged up to +V volts. The array is then in a condition to be read out.

The dummy row conductors (PS2,PS3) nearest the decoder 20 are useful in the event of an aborted read-out cycle. For example, assume the row conductors of array 10 to have been charged, to +$V_{DD}$ volts, and that +V volts were applied to a selected column conductor for such a short period of time that only a few of the rows nearest to the decoder had been discharged before the selected column conductor was driven to zero volts. In such a case the farthest row conductors PS1, PS4 would still be fully charged to +$V_{DD}$ volts and would tend to produce an output at sense gate 50 terminating the precharge cycle prematurely. However, row conductors PS2, PS3 cause the output of sense gate 50 to indicate a discharge condition until PS2, and PS3 are recharged which means that the rows adjacent to these two dummy rows will also be recharged.

A distinct advantage of circuits embodying the invention is that read out of the memory array contents may be initiated as soon as the dummy rows are charged to approximately +V volts, which is indicative that all the rows of the array have also been charged to +V volts. The "low" output of sense gate 50 resets circuit 30 and removes the decoder disable signal on line 22. The contents of the memory array can then be read immediately upon completion of the charging of the row conductors to +V volts.

The precharge sensing circuit stretches the precharge pulse as is necessary to compensate for delays introduced by the array. A test circuit was designed to test the effect of varying the column resistance over a wide range. The precharge sensing circuit was able to accommodate large variations in the impedances of the columns, varying the duration of the precharge pulse from 190 nanoseconds to 1,370 nanoseconds. In prior art circuits if the worst case delay was 1,370 nanoseconds, then the precharge pulses would (for proper operation) have that duration and a delay of that value would be set into the precharge read-out cycles. In contrast thereto in the circuit of the invention there is automatic termination of the charge cycle so that the charge time, although it may vary from array to array and under different operating conditions, will always be the minimum time required to properly charge the row conductors under and for all operating conditions.

The invention has been illustrated for the case where the "bit" transistors were of N-conductivity type and where the row conductors were first (pre)charged to +V volts and then selectively (dis)charged to ground. It should be evident that the memory array bit transistors could be, instead, of P-conductivity type with the row conductors being first (dis)charged to ground potential and then selectively charged to +V volts. Thus, the invention is applicable to a complementary operation to that described i.e. first discharging all the rows prior to read and then selectively charging during read. It should, therefore, be understood that the terms "charging" and "discharging" as used herein and in the accompanying claims are relative and should also be understood as "charging" to one level and "charging" or "discharging" to a second level.

What is claimed is:

1. The combination comprising:
   a matrix array of row and column conductors, the intersection of each row and column conductor defining a bit location and each bit location storing binary data; said array being characterized in that corresponding to the enabling of a column conductor, the row conductors remain charged at a first level or are placed at a second level depending on the value of the binary data at the intersection of a row and the enabled column;
   an additional row conductor storing the same binary data at every one of its bit locations of a value for placing said row conductor at said second level each time a column conductor is enabled;
   a set-reset circuit having input means; and an output; said circuit being responsive to a set signal at its input means for setting and maintaining its output at a first binary condition, and responsive to a reset signal at its input means for setting and maintaining its output at the other binary condition;
   charging means responsive to the output of said set-reset circuit, connected to each row conductor including said additional row conductor for charging all of said row conductors to said first level in response to the presence of said first binary condition; and
   sensing means having an input connected to said additional row conductor and having an output connected to said input means of said set-reset circuit, said sensing means being responsive to the level to which said additional row conductor is charged and producing a reset signal to said set-reset circuit for terminating the charging of said row conductors when the level on said additional row conductor reaches a predetermined value.

2. The combination as claimed in claim 1 wherein said memory array includes at least one transistor at each bit location, each transistor having first and second electrodes defining the ends of a conduction path and a control electrode, the control electrodes of the transistors of each column being connected to the column conductor for that column, the second electrodes of all the transistors being connected to a point of fixed potential, and
   means connecting the first electrodes of the transistors at a bit location storing binary data of a value to place the row at said second level to the row conductor of that bit location for providing a conduction path between the row conductor of that row and said point of fixed potential.

3. The combination as claimed in claim 2 wherein each transistor in said additional row is connected at its first electrode to the row conductor for that row.

4. The combination as claimed in claim 3 wherein said transistors of said additional row have a lower impedance conduction path than the impedance of the conduction paths of the other transistors of the memory array.

5. The combination as claimed in claim 4 wherein said matrix array is a read only memory array.

6. The combination as claimed in claim 5 wherein said additional row conductor is located at one end of a column of said matrix array and further including a second additional row conductor located at the other end of a column of said array.

7. The combination as claimed in claim 6 wherein said sensing means includes an input per additional row conductor, each input being connected to a different one of said additional row conductors said sensing means producing a resetting signal to said set-reset circuit when all of said additional row conductors are charged to said first level.

8. The combination as claimed in claim 1 including means for selectively enabling said column conductors comprising a decoding means having a control input, input circuit means adapted to receive input address signals, and having one output per column conductor;
   means coupling said control input to the output of said set-reset circuit for inhibiting said decoder and preventing the application of any enabling signal to the column conductors when the output of said set-reset circuit is at said first binary condition and enabling said decoder when the output of said set-reset circuit is at said other binary condition, whereby said decoder is then capable of enabling one of said column conductors at a time in response to address signals applied to its input circuit means.

9. The combination as claimed in claim 8 wherein said decoder is physically located approximately in the center of the columns of said array;
   wherein one portion of said array is located on one side of said decoder and another portion of said array is located on the other side of said decoder; and wherein each one of said portions includes two of said additional row conductors one of said two additional rows being the first row nearest to said decoder means and the other of said two additional row being the last row located along the columns farthest from said decoder.

* * * * *